United States Patent
Lai et al.

(10) Patent No.: US 9,013,948 B2
(45) Date of Patent: *Apr. 21, 2015

(54) MEMORY ARCHITECTURE FOR DISPLAY DEVICE AND CONTROL METHOD THEREOF

(71) Applicant: Novatek Microelectronics Corp., Hsinchu (TW)

(72) Inventors: Ching-Wen Lai, Hsinchu (TW); Hsi-Chi Ho, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/181,162

(22) Filed: Feb. 14, 2014

(65) Prior Publication Data
US 2014/0164691 A1 Jun. 12, 2014

Related U.S. Application Data

(63) Continuation of application No. 13/428,002, filed on Mar. 23, 2012, now Pat. No. 8,675,443.

(30) Foreign Application Priority Data

Mar. 24, 2011 (TW) ............................. 100110199 A

(51) Int. Cl.
*G11C 8/00* (2006.01)
*G11C 11/406* (2006.01)
*G11C 8/12* (2006.01)
*G11C 8/18* (2006.01)

(52) U.S. Cl.
CPC ............ *G11C 11/40603* (2013.01); *G11C 8/12* (2013.01); *G11C 8/18* (2013.01)

(58) Field of Classification Search
USPC .......................... 365/230.03–230.06, 189.04, 365/189.16–189.17
See application file for complete search history.

(56) References Cited

U.S. PATENT DOCUMENTS

| 6,744,692 B2 | 6/2004 | Shiota et al. |
| 7,522,468 B2 | 4/2009 | Norman |
| 7,911,871 B2* | 3/2011 | Hidaka ..................... 365/230.03 |
| 8,675,443 B2* | 3/2014 | Lai et al. .................. 365/230.03 |

FOREIGN PATENT DOCUMENTS

| CN | 101930713 A | 12/2010 |
| TW | 201044371 A | 12/2010 |

OTHER PUBLICATIONS

Chinese Office Action dated on Jun. 24, 2014.

* cited by examiner

*Primary Examiner* — David Lam
(74) *Attorney, Agent, or Firm* — Rabin & Berdo, P.C.

(57) ABSTRACT

A memory architecture for a display device and a control method thereof are provided. The memory architecture includes a display data memory and a memory controller. The display data memory includes N sub-memories and N×M arbiters, wherein N is a positive integer and M is a positive integer equal to or greater than 2. Each sub-memory includes M memory blocks divided by an address. Each M arbiters are coupled to the M memory blocks of each sub-memory. The memory controller, coupled to the N×M arbiters, generates N×M sets of request signals and output address signals according to a set of an input request signal and an input address signal, and transmits to the N×M arbiters to sequentially control the N×M arbiters.

11 Claims, 10 Drawing Sheets

| | x → | | | | | | |
|---|---|---|---|---|---|---|---|
| A (1,1) | B (2,1) | C (3,1) | D (4,1) | A (5,1) | B (6,1) | C (7,1) | D (8,1) |
| B (1,2) | C (2,2) | D (3,2) | A (4,2) | B (5,2) | C (6,2) | D (7,2) | A (8,2) |
| C (1,3) | D (2,3) | A (3,3) | B (4,3) | C (5,3) | D (6,3) | A (7,3) | B (8,3) |
| D (1,4) | A (2,4) | B (3,4) | C (4,4) | D (5,4) | A (6,4) | B (7,4) | C (8,4) |
| A (1,5) | B (2,5) | C (3,5) | D (4,5) | A (5,5) | B (6,5) | C (7,5) | D (8,5) |
| B (1,6) | C (2,6) | D (3,6) | A (4,6) | B (5,6) | C (6,6) | D (7,6) | A (8,6) |
| C (1,7) | D (2,7) | A (3,7) | B (4,7) | C (5,7) | D (6,7) | A (7,7) | B (8,7) |
| D (1,8) | A (2,8) | B (3,8) | C (4,8) | D (5,8) | A (6,8) | B (7,8) | C (8,8) |

MEMORY ARCHITECTURE FOR DISPLAY DEVICE AND CONTROL METHOD THEREOF

This application is a continuation application of U.S. patent application Ser. No. 13/428,002, filed Mar. 23, 2012, now U.S. Pat. No. 8,675,443, which claims the benefit of Taiwan application Serial No. 100110199, filed Mar. 24, 2011, the subject matters of which are incorporated herein by reference.

TECHNICAL FIELD

The disclosure relates in general to a memory architecture and a control method thereof, and more particularly to a memory architecture for a display device and a control method thereof.

BACKGROUND

Display data RAM (DDRAM) becomes increasingly important along with rapid growth of display techniques. A DDRAM is built in a display device and an access speed of the DDRAM greatly affects performance of the display device.

To increase access speed, DDRAM frequently controls an order of operations through an arbiter. In other words, when so-called collisions occur due to simultaneous write/read operations, the arbiter appropriately arranges a processing sequence of the operations, usually by delaying some of the operations.

FIG. 1 shows a timing diagram of signals in a conventional display device. For example, an arbiter generates a set of output signals WREQ_Q, DREQ_A and ADR_A according to a set of input signals WREQ, WADR, DREQ and DADR. The write signal WREQ and the address signal WADR are for write operations. The display signal DREQ and the address signal DADR are for display operations. In this example, as indicated by the address signal ADR_A generated by the arbiter, the write operation occupies two write/read cycles of the arbiter, e.g., a period P1. The display operation occupies three write/read cycles of the arbiter, e.g., a period P2. At a time point t1, a pulse occurs in the write signal WREQ, and in response to an address [0] assigned by the write address signal WADR, the arbiter performs the write operation of the address [0]. At a time point t2, a pulse occurs in the display signal DREQ, and in response to an address [a] assigned by the display address signal DADR, the arbiter performs the display operation of the address [a]. However, due to the previous write operation of the address [0] is not completed, a collision is incurred which causes the arbiter to postpone the display operation of the address [a] to a time point t3. Similarly, the write operation of an address [1] is postponed to a time point t4, and the write operation of an address [2] is postponed to a time point t5. However, between the time points t5 and t6, the arbiter is overloaded and the arbiter loses a part of the operations, e.g., the display operation of an address [b] may be lost by the arbiter.

It is concluded from the above description that, the speed of a DDRAM is determined by a write/read cycle of an arbiter when a DDRAM accesses data in a unit of one pixel. Under such conditions, when the arbiter is demanded to write, read or display data in high speed, the arbiter delays the write or read operations due to collisions, which may lead to lose of write or read operations. Further, for a DDRAM having a large capacity, the resistance load is aggravated due to long signal wires, such that not only time margins are reduced but also access failures are likely resulted from the high speed write operations.

SUMMARY OF THE DISCLOSURE

The disclosure is directed to a memory structure for a display device and a control method thereof, which allow memory data access through multiple arbiters.

According to an example of the present disclosure, a memory structure for a display device is provided. The memory structure includes a display data memory and a memory controller. The display data memory includes N sub-memories and N×M arbiters, where N is a positive integer and M is a positive integer equal to or greater than 2. Each sub-memory includes M memory blocks divided according to an address. Every M arbiters are respectively coupled to the M memory blocks of each sub-memory. The memory controller, coupled to the N×M arbiters, generates N×M sets of request signals and outputs address signals according to a set of an input request signal and an input address signal, and transmits to the N×M arbiters to sequentially control the N×M arbiters.

According to another example of the present disclosure, a control method for a memory structure of a display device is provided. The memory structure includes a display data memory and a memory controller. The display data memory includes N sub-memories and N×M arbiters, where N is a positive integer and M is a positive integer equal to or greater than 2. The method includes: receiving a set of an input request signal and an input address signal; generating N×M sets of output request signals and output address signals according to the set of input request signal and input address signal; and transmitting the N×M sets of output request signals and output address signals to the N×M arbiters to sequentially control the N×M arbiters. Each M arbiters are respectively coupled to M memory blocks, divided according to an address, in each sub-memory.

It is to be understood that both the foregoing general description and the following detailed description are exemplary and explanatory only and are not restrictive of the disclosed embodiments, as claimed.

BRIEF DESCRIPTION OF THE DRAWINGS

FIG. 8 is a schematic diagram of a relationship between the pixels and the arbiters according to the pixel arrangement in FIG. 7.

FIG. 9 is a schematic diagram of a partition example of a 16×16 display region.

DETAILED DESCRIPTION OF THE DISCLOSURE

One embodiment of the present disclosure is directed to a memory architecture for a display device and a control method thereof, so as to allow high-speed memory access through multiple arbiters.

Figure 1:
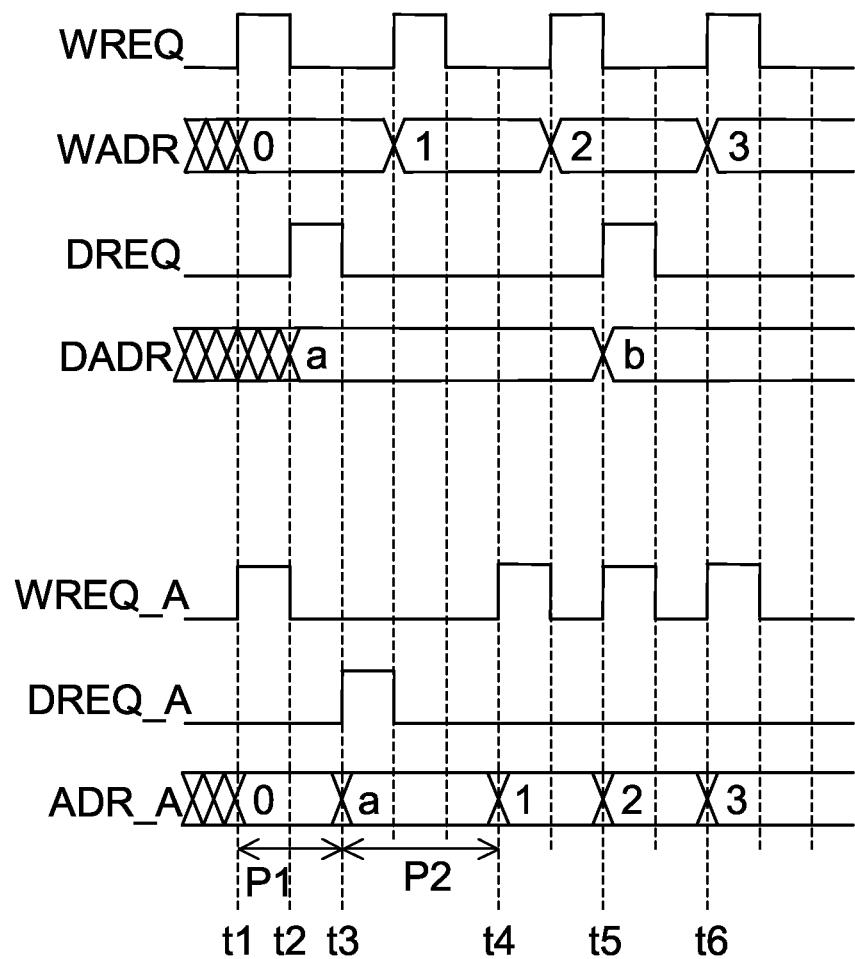
FIG. 1 (PRIOR ART) is a timing diagram of signals in a conventional display device.
Figure 2:
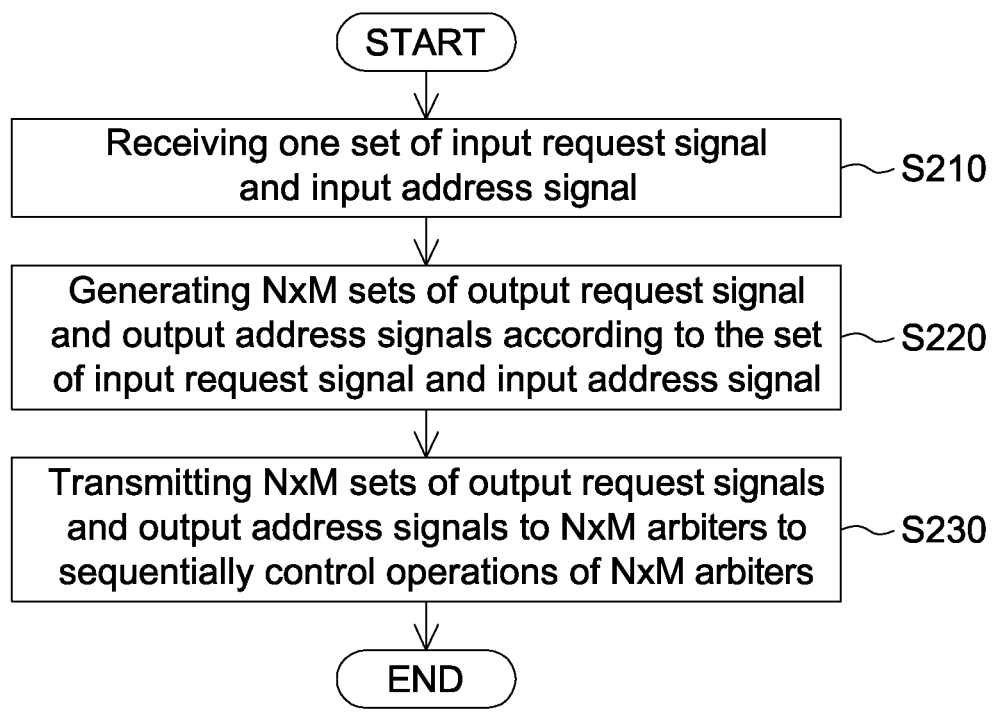
FIG. 2 is a flowchart of a control method according to an embodiment of the present disclosure.

FIG. 2 shows a flowchart of a control method according to an embodiment of the present disclosure. The control method is applicable to a memory structure of a display device. The memory structure includes a display data memory which includes N sub-memories and N×M arbiters, where N is a positive integer and M is a positive integer greater than 2. Each M arbiters are coupled to M memory blocks divided based on an address. Steps of the control method are described below. In Step S210, a set of an input request signal and an input address signal is received. In Step S220, N×M sets of output request signals and output address signals are generated according to the set of input request signal and input address signal. In Step S230, the N×M sets of output request signals and output address signals are transmitted to the N×M arbiters to sequentially control operations of the N×M arbiters. With such arbiter structure, the data access speed of the memory is increased. A display device implementing the control method is described below.

Figure 3:
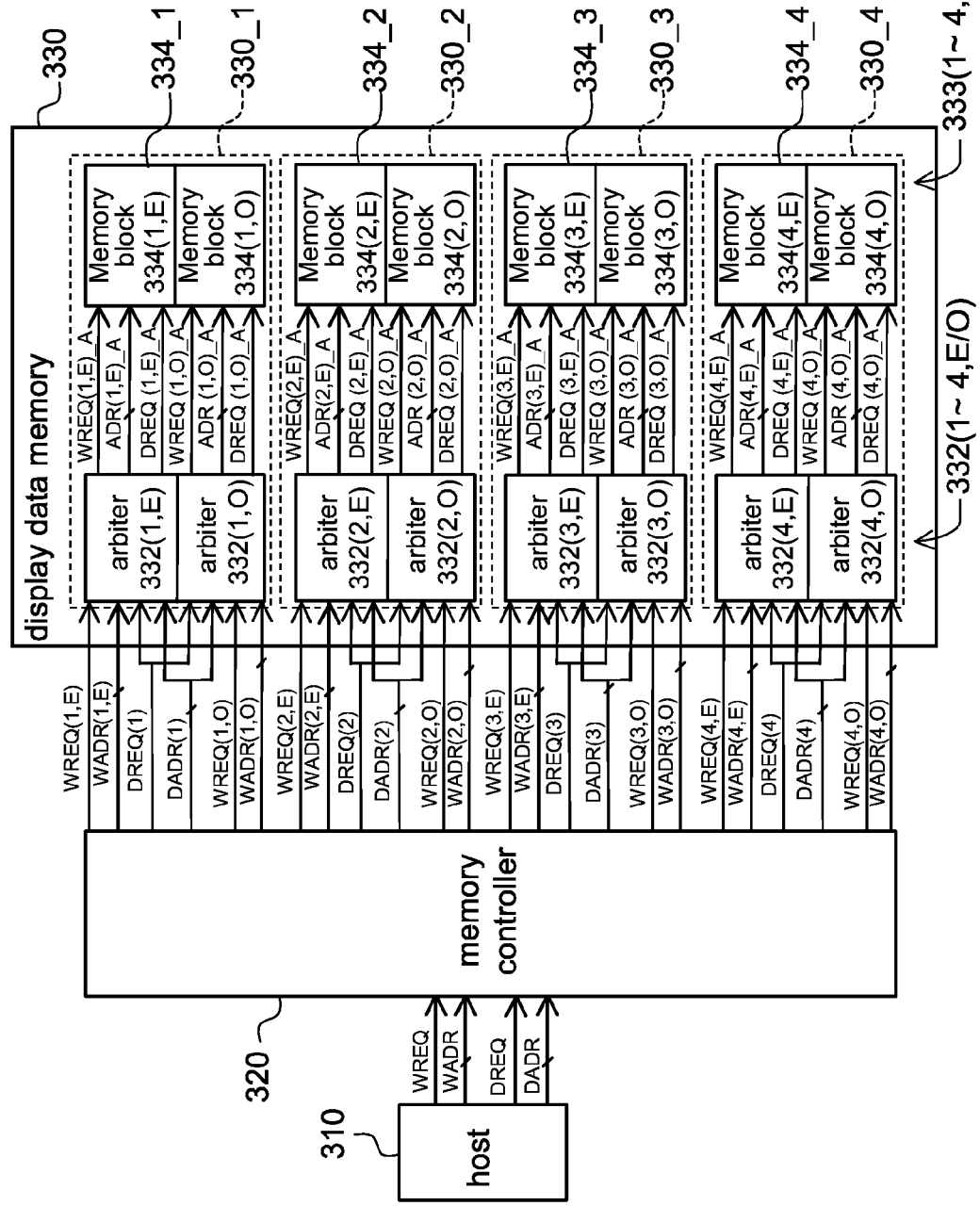
FIG. 3 is a block diagram of a display device according to an embodiment of the present disclosure.

FIG. 3 shows a block diagram of a display device according to an embodiment of the present disclosure. In this embodiment, a display device 300 includes a host 310, a memory controller 320 and a display data memory 330. For example, the host 310 is a central processing unit, or other processing unit having operational capabilities. The memory controller 320 is coupled between the host 310 and the display data memory 330, to serve as a communication interface between the host 310 and the display data memory 330. The display data memory 330 includes N sub-memories and N×M arbiters, e.g., four sub-memories 334_1 to 334_4, and eight arbiters 332(1~4, E/O). In other words, (N, M)=(4, 2) is taken as an example in this embodiment, so that the display data memory 330 includes N(=4) sub-memories and N×M(=8) arbiters.

In the sub-memories 334_1 to 334_4, each memory includes two memory blocks divided by address. Therefore, the four sub-memories 334_1 to 331_4 include 8 memory blocks 334(1~4, E/O) in total. The memory blocks 334(1~4, E) may be referred to as even memory blocks and the memory blocks 334(1~4, O) may be referred to as odd memory blocks, and they are addressed by a least significant bit (LSB) of address, for example. The disclosure is not limited by this. Supposing two LSBs of an address are utilized for addressing, one sub-memory may be divided into 4(=$2^2$) memory blocks. In the embodiment, M is designed as a positive integer power of 2. In other embodiments, in the case of the memory controlling having an address decoder, M may be set as other positive integers greater than 2.

As for the eight arbiters 332 (1~4, E/O), each two arbiters are respectively coupled to two memory blocks in each sub-memory. For example, the arbiters 332(1, E) and 332(1, O) are respectively coupled to the memory blocks 334(1, E) and 334(1, O); the arbiters 332(2, E) and 332(2, O) are respectively coupled to the memory blocks 334(2, E) and 334(2, O); the arbiters 332(3, E) and 332(3, O) are respectively coupled to the memory blocks 334(3, E) and 334(3, O); and the arbiters 332(4, E) and 332(4, O) are respectively coupled to the memory blocks 334(4, E) and 334(4, O).

The memory controller 320 is coupled to the eight arbiters 332(1~4, E/O) for sequentially control operations of the eight arbiters 332(1~4, E/O). To control the operations of the arbiters, for example, the memory controller 320 generates eight sets of output request signals and output address signals according to a set of an input request signal and an input address signal provided by the host 310, and respectively transmits the eight sets of output request signals and output address signals to the eight arbiters 332(1~4, E/O), so the arbiter to process a corresponding memory block. Hence, through the memory data display having eight arbiters, cycle periods of the output request signals and output address signals generated by the memory controller may be lengthened to, e.g., 8 times of the cycle period of the input request signal. In other words, the memory controller generates low frequency output signals so as to allow the arbiters to have more write/read time margin.

In the above description, (N, M)=(4, 2) is taken as an example for illustrative purposes but not to be construed as limiting the present disclosure. The cycle periods of the output signals of the display data memory may be lengthened to N×M times to further lengthen the cycle period of the arbiters. From another perspective, the memory controller may receive and process high frequency input signals and the data access speed is increased. Thus, in the embodiment, not only the data access speed of the display data memory is significantly increased but performance of the display device is also enhanced.

Figure 4A:
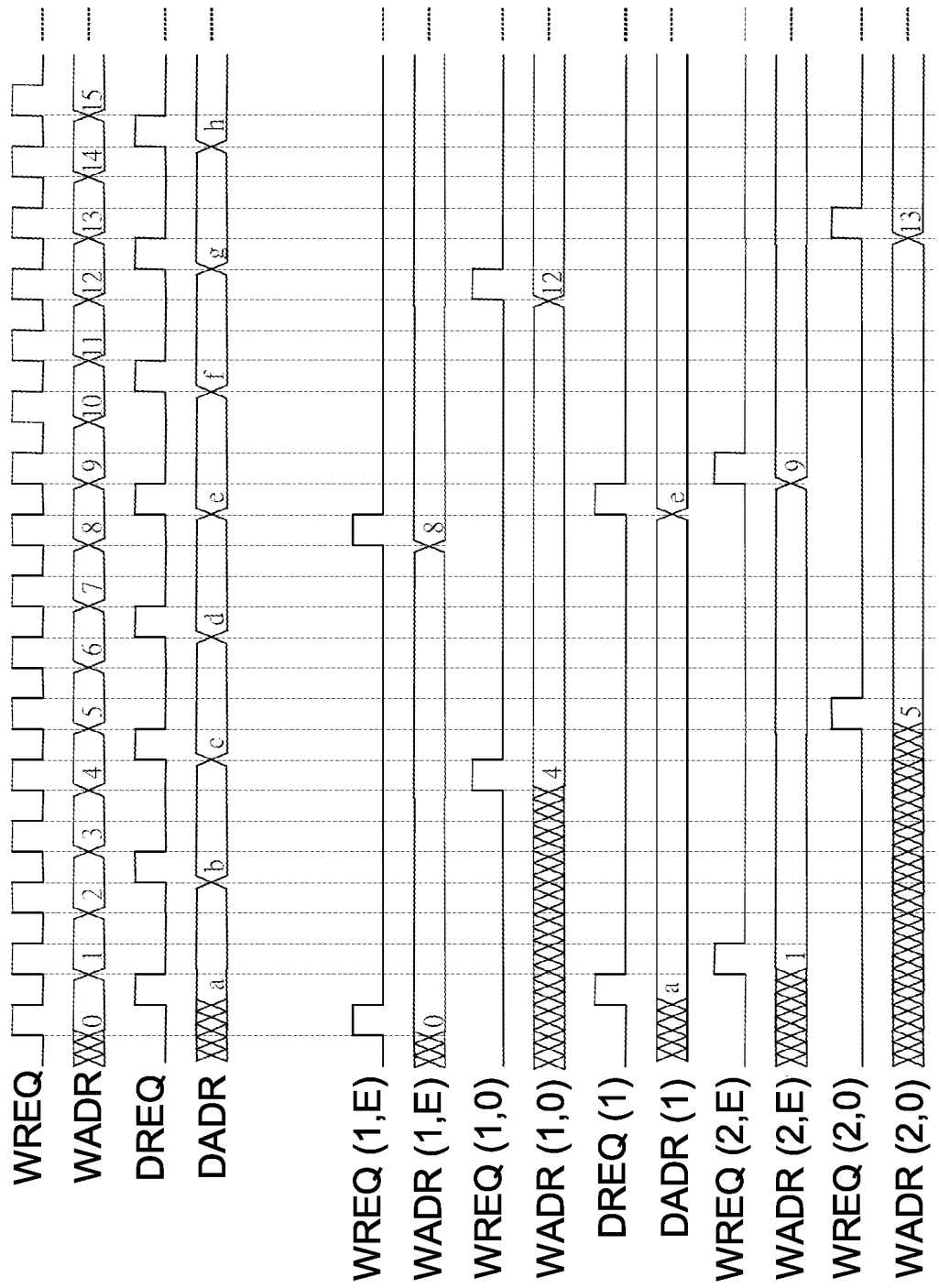
FIGS. 4A and 4B are respectively a timing diagram of input signals and output signals of the memory controller in FIG. 3.
Figure 4B:
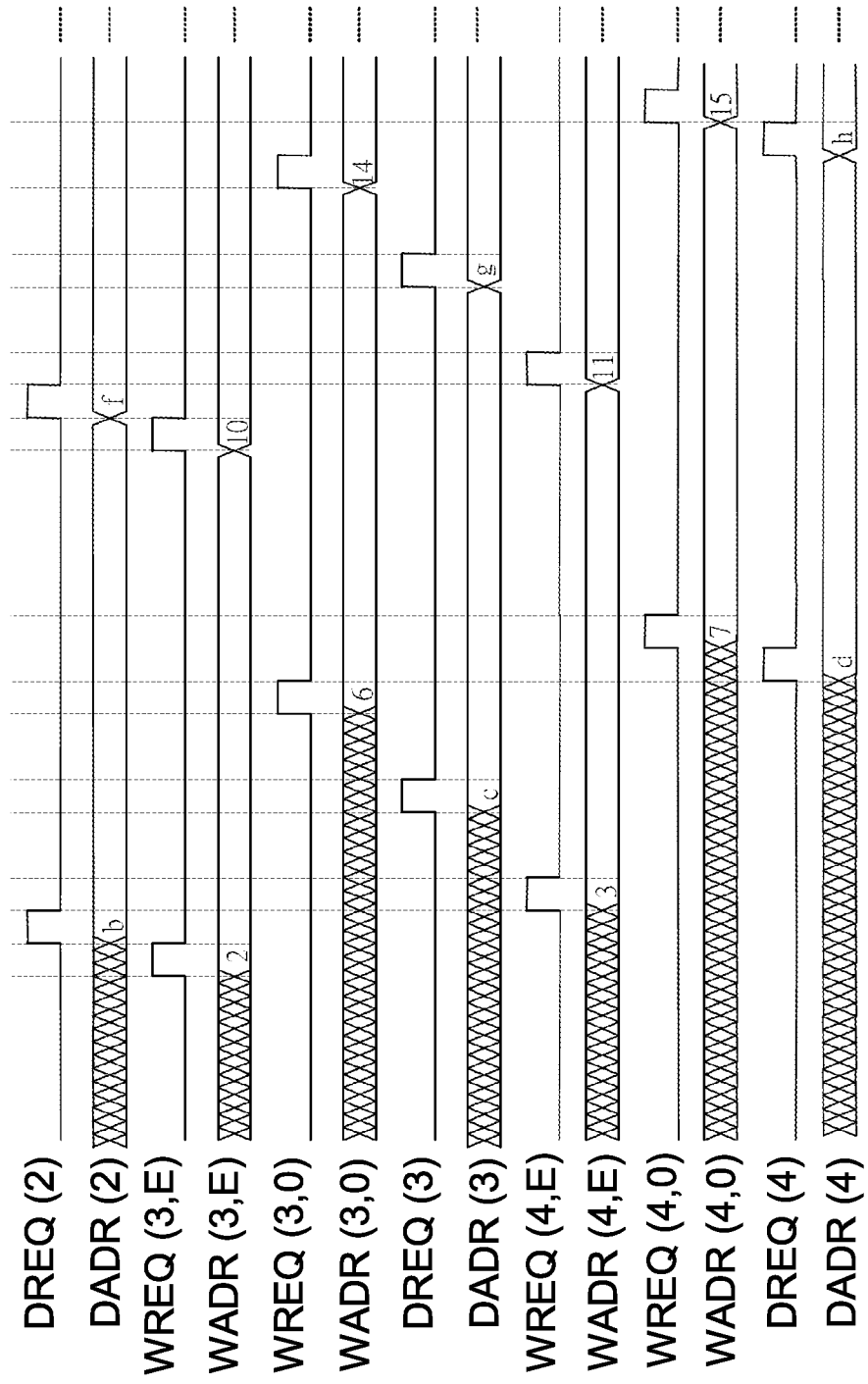

The description below is given with reference to FIGS. 3, 4A and 4B. FIGS. 4A and 4B show examples of timing diagrams of the input signals and the output signals of the memory controller in FIG. 3. The set of input request signal and input address signal provided by the host 310 includes a write request signal WREQ and a write address signal WADR. According to the write request signal WREQ and the write address signal WADR, the eight sets of output request signals and output address signals generated by the memory controller 320 include eight write request signals WREQ (1~4, E/O) and eight write address signals WADR(1~4, E/O), which are respectively provided to the eight arbiters 332(1~4, E/O).

For the memory controller 320, the input write request signal WREQ may be a series-in pulse signal, e.g., a signal having serial pulses. Such write request signal WREQ indicates that the host 310 writes data in a unit of a single pixel. In response to the write request signal WREQ, the memory controller 320 generates pulses in the write request signals WREQ(1~4, E/O) and the cycle periods of the write request signals are lengthened. More specifically, in response to first eight pulses (corresponding to write addresses [0] to [7]) of the write request signal WREQ, for example, the sequence of the pulses generated by the memory controller 320 is the write request signal WREQ(1, E), the write request signal WREQ (2, E), the write request signal WREQ(3, E), the write request signal WREQ(4, E), the write request signal WREQ(1, O), the write request signal WREQ(2, O), the write request signal WREQ(3, O), and the write request signal WREQ(4, O). The write address signals WADR(1~4, E/O) are generated similarly. Thus, the cycle periods of the write request signals WREQ(1~4, E/O) and the write address signals WADR(1~4, E/O) may be lengthened.

For eight subsequent pulses (corresponding to write addresses [8] to [15]) of the write request signal WREQ, the sequence of pulses WREQ(1~4, E/O) are generated similarly as the first eight pulses of the input request signal WREQ. Therefore, the cycle period of each of the eight write requests WREQ(1~4, E/O) may be lengthened to N×M times, which is eight times in this embodiment.

The set of the input request signal and the input address signal provided by the host 310 may further include a display request signal DREQ and a display address signal DADR. Correspondingly, the eight sets of output request signals and output address signals generated by the memory controller 320 include four display request signals DREQ(1~4) and four display address signals DADR(1~4). The display request signal and the corresponding display address signal are transmitted to the two arbiters coupled to the same sub-memory. For example, the display request signal DREQ(1) and the display address signal DADR(1) are transmitted to the two arbiters 332(1, E/O) coupled to the sub-memory 334_1. Likewise, the cycle periods of the display request signals DREQ (1~4) and the display address signals DADR(1~4) may be lengthened.

Figure 5A:
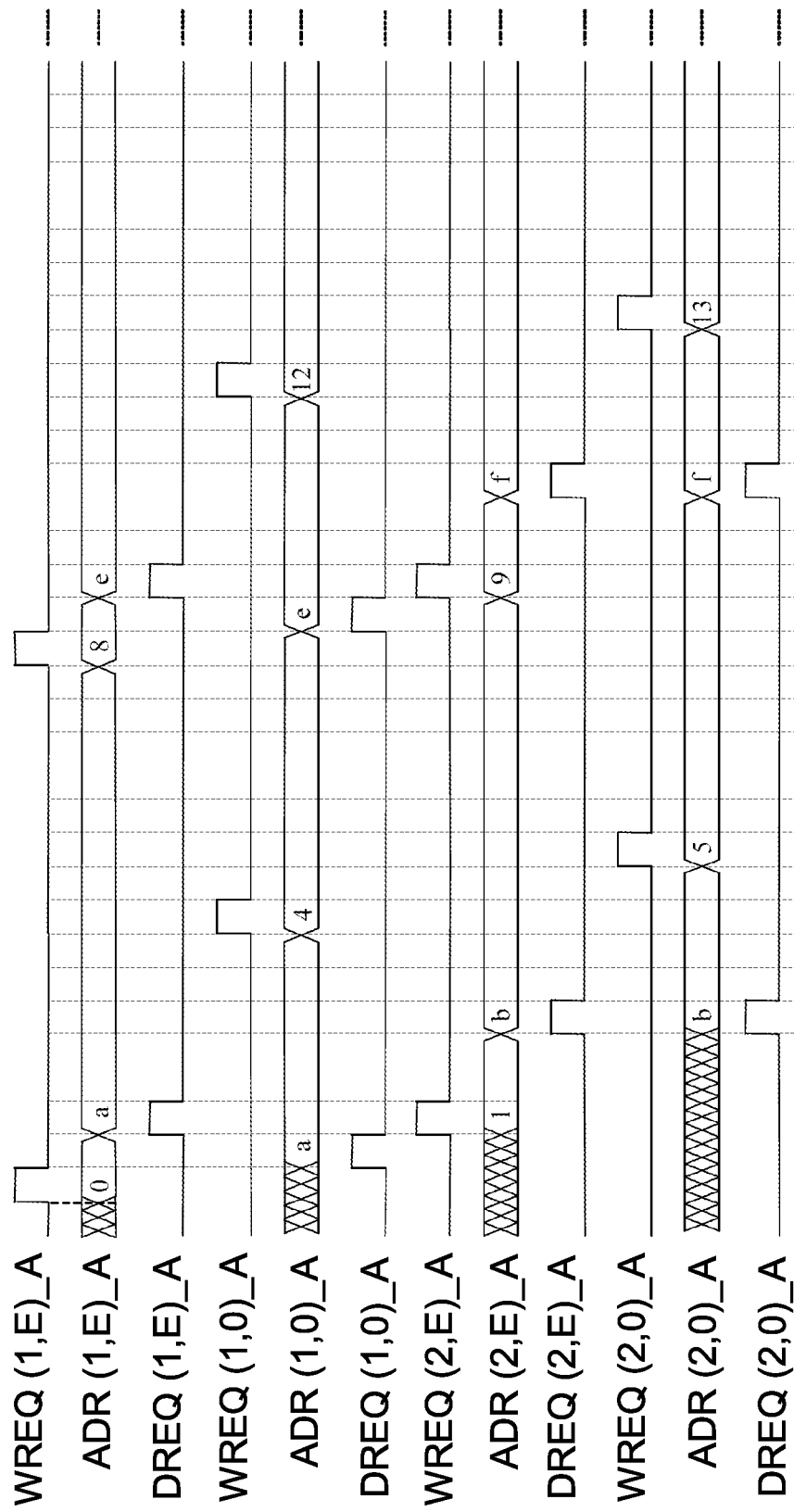
FIGS. 5A and 5B are timing diagrams of input signals and output signals of the arbiter in FIG. 3.
Figure 5B:
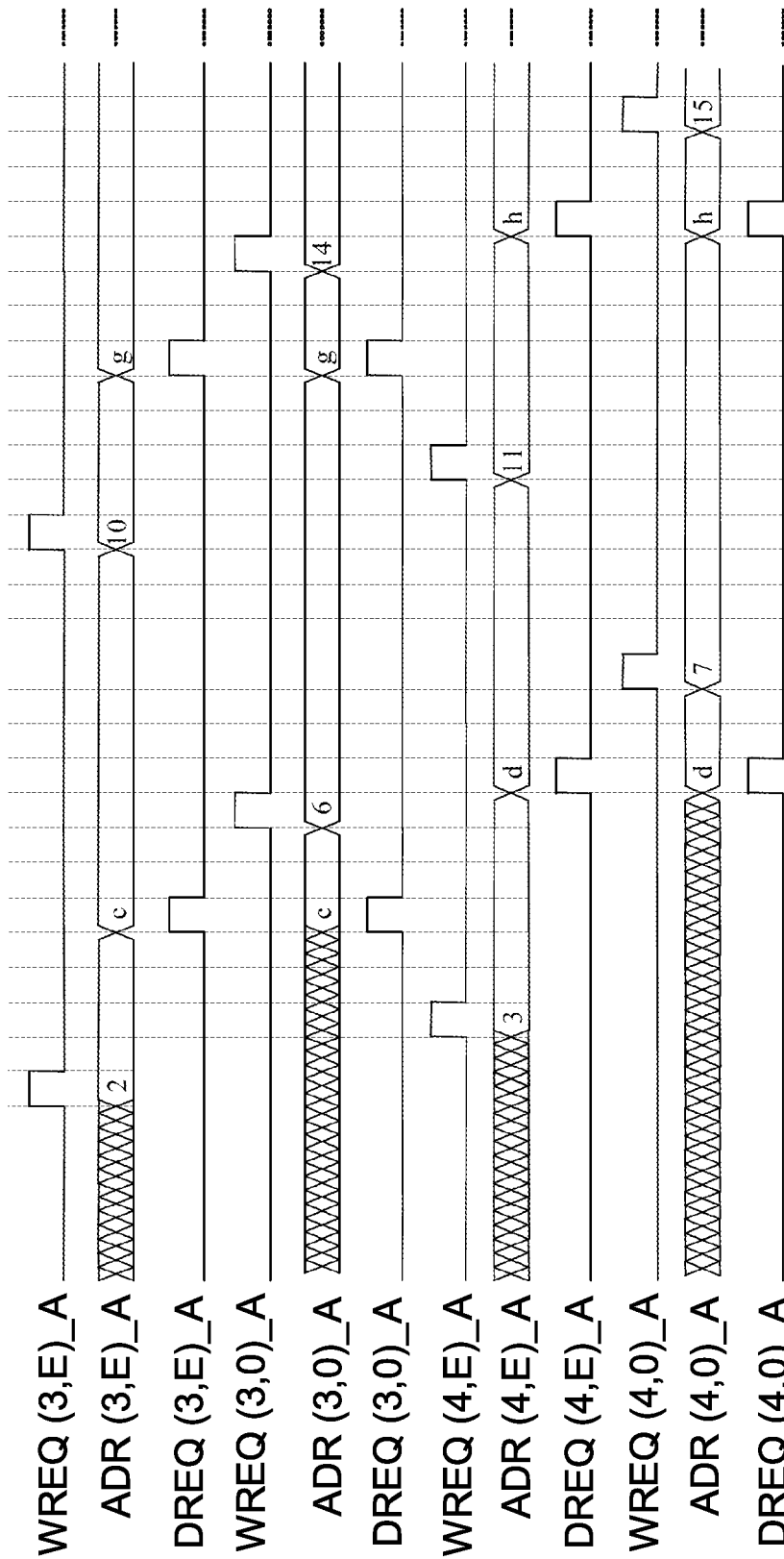

FIGS. 5A and 5B show examples of timing diagrams of the input signals and the output signals of the arbiters in FIG. 3. Upon receiving the eight sets of output request signals and output address signals from the memory controller 320, the eight arbiters 332(1~4, E/O) respectively generate eight sets of sub-signals. Each set of the sub-signals includes three sub-signals, i.e. a sub-write request signal WREQ(1, E) A, a sub-address signal ADR(1, E)_A, and a sub-display request signal DREQ(1, E)_A. Thus, the arbiters handle collisions of the corresponding memory blocks. For example, the arbiter 332(1, E) handles a collision caused by a write operation at the address [0] and a display operation at the address [a]. Accordingly, although the display operation at the address [a] is delayed, the arbiter still has sufficient write/read time for processing the delayed operation since the cycle period is lengthened, thereby eliminating loss of read or write operation.

Again referring to FIG. 3, in the display data memory 330, each sub-memory and the two corresponding arbiters may be regarded as a sub-display data memory, which means four sub-display data memories 330_1 to 330_4 are shown in FIG. 3. In an embodiment, to prevent that a write direction change causes invalid signal time sharing (i.e., to prevent that the cycle period of the arbiters cannot be lengthened), the operating order of the N sub-display data memories as well as the operating order of the M memory blocks in each of the sub-display data memories are substantially symmetrical. In other words, the switch is in a unit of N×M pixels so that signals perceived by each of the sub-display data memories are symmetrical. Also, as described above, if there are N(N=4) sub-display data memory and each of the sub-display data memories includes M memory blocks. In data writing, data of (N×M) pixels are in one unit so that the write speed in the sub-display data memory is 1/(N*M) of the write speed for the source data input to the sub-display data memory. Details of the above shall be given with reference to FIGS. 6, 7 and 8 as well as the example in FIG. 3.

Figures 6, 7:
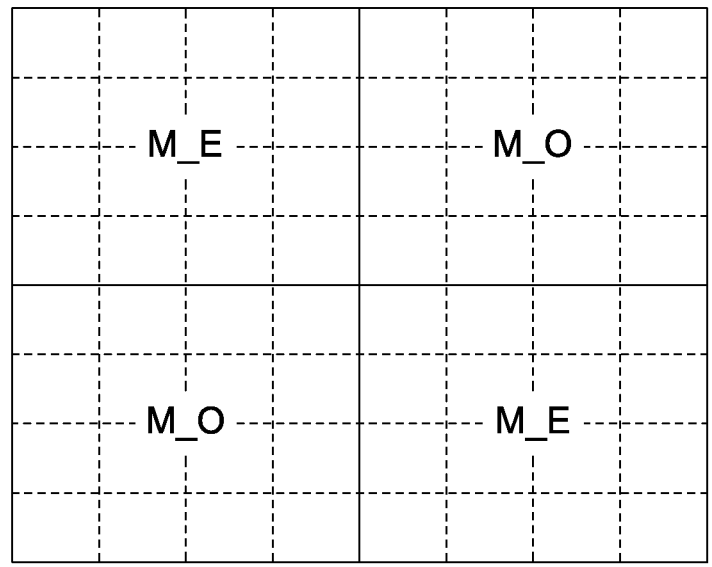
FIG. 6 is a schematic diagram of a partition example of an 8×8 display region.
FIG. 7 is a schematic diagram of a pixel arrangement example in the display region in FIG. 6.
Figure 8:
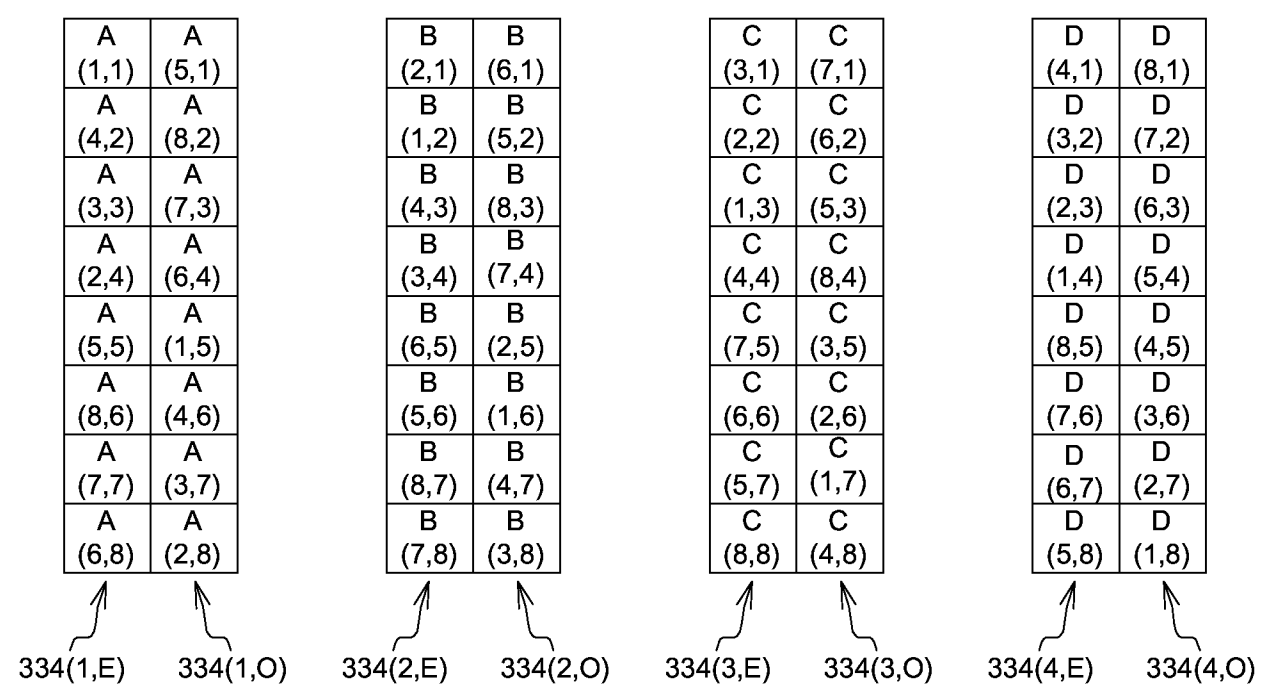

FIG. 6 shows a schematic diagram of a partition example of an 8×8 display region. FIG. 7 shows a schematic diagram of a pixel arrangement example in the display region in FIG. 6. FIG. 8 shows a schematic diagram of a relationship between the pixels and the arbiters according to the pixel arrangement in FIG. 7.

As shown in FIG. 6, because the display data memory 330 may be divided into N(=4) display data memories 330_1 to 330_4, the 8×8 display region is divided into N×N (=4×4) display areas. Thus, four display areas are shown in FIG. 6. The four display areas are defined as two even regions M_E and two odd regions M_O, which are symmetrical and respectively correspond to the even memory blocks 334(1~4, E) and the odd memory blocks 334(1~4, O).

Referring to FIG. 7, on the 8×8 display region, the display device 300 displays 64 image data A/B/C/D(1~8, 1~8) in a unit of a single pixel. Data A is located in the sub-display data memory 330_1, and data B is located in the sub-display data memory 330_2. Therefore, as observed from the display areas in FIG. 7, a sequence of the sub-display data memories 330_1 to 330_4 related to the image data is periodical as for either a horizontal direction x or a vertical direction y, meaning that operation sequences of the sub-display data memories 330_1 to 330_4 are symmetrical. Further, data A in the even area M_E is located in the memory block 334(1, E), and data A in the odd area M_O is located in the memory block 334(1, O). It is thus inferred that operation sequences of the two memory blocks in each of the sub-display data memories are also symmetrical.

Suppose the input request signal includes 64 successively input pulses, and each pulse is for writing a pixel data. At this point, the generation sequence of the 64 pulses may correspond to a write sequence of the 64 image data in FIG. 7.

In an embodiment, in response to a k-th pulse and a (k+1)-th pulse of an input request signal, the memory controller generates two respective pulses in two output request signals and respectively transmits the pulses to two arbiters, where k is a positive integer. Taking FIG. 7 as an example. k=1. To write in the x direction, the first pulse corresponds to the first data A(1, 1), and the second pulse corresponds to the second data B(2, 1). The two data A(1, 1) and B(2, 1) are handled by the arbiters 332(1, E) and 332(2, E). Thus, the memory controller 320 generates two pulses in the two output request signals i.e. the display request signals DREQ(1, E) and DREQ(2, E), and the two pulses are transmitted to the arbiters 332(1, E) and 332(2, E) to prevent a collision. Similarly, to write in the y direction, a collision is prevent in writing the two data A(1, 1) and B(1, 2). Accordingly, the arbiters of the same sub-memory are not allowed to simultaneously access data and thus collision is prevented.

In another embodiment, in response to a k-th pulse and a (k+(N×M))-th pulse, the memory controller generates two pulses in two output request signals and transmits the pulses to two arbiters, where k is a positive integer. Taking FIG. 7 as an example, N equals 4, M equals 2, and k+(N×M) equals k+8. k=1. If to write in the x direction, the first pulse corresponds to the first data A(1, 1), and the (k+(N×M))-th pulse corresponds to the ninth data B(1, 2). The two data A(1, 1) and B(1, 2) are handled by the arbiters 332(1, E) and 332(2, E). Similarly, this embodiment is capable of preventing an arbiter from successively accessing data so as to reduce collision possibilities. Likewise, the same principle applies in writing in the y direction.

The above description taking pulses as an example is to illustrate that the memory controller sequentially controls operations of the N×M based on a data write direction. In other words, as shown in FIG. 7, to write in either the horizontal x direction or the vertical y direction, one arbiter is prevented from successively processing two data to ensure that the cycle period of the arbiter is lengthened.

Figure 9:
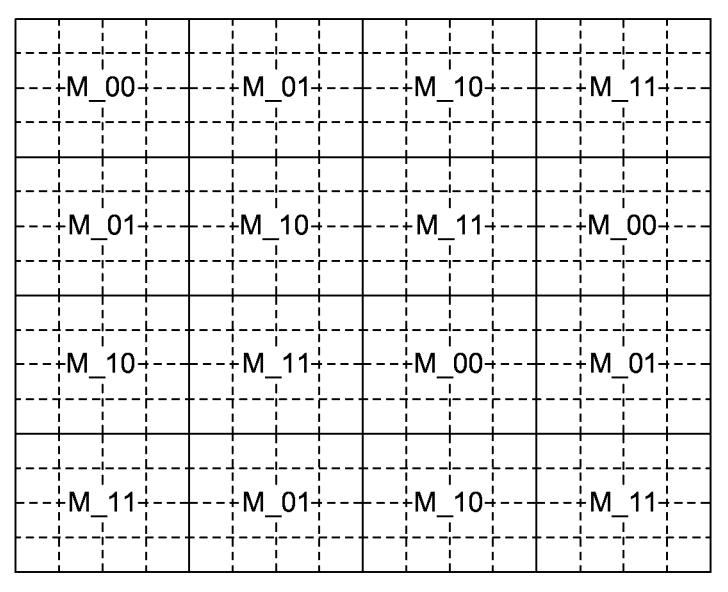

FIG. 9 shows a schematic diagram of a partition example of a 16×16 display region. In this example, (N, M)=(4, 4), that is, each sub-memory of the display data memory is divided into four memory blocks. According to the N(=4) sub-memories, the 16×16 display region may be divided into N×N(=4×4) display areas. Thus, 16 display areas are shown in FIG. 9. The display areas M_00, M01, M_10 and M11 are symmetrical and respectively correspond to the four memory blocks in each sub-memory. It is known that the cycle period of each arbiter may be lengthened in writing in either the horizontal x direction or the vertical y direction.

With the embodiments above, it is illustrated that the memory structure for the display device and the control method thereof disclosed by embodiments of the present disclosure have many advantages, some of which shall be given below.

First of all, since numerous arbiters are utilized to control access operations of the sub-memories in the display data memory, the cycle period of the arbiters may be lengthened to prevent error write/read operations resulted from excessive or frequent collisions.

Another advantage is that time margins are increased due to lowered frequencies. Further, since each sub-memory in the display data memory includes multiple memory blocks, the data wires may be shortened to not only reduce the circuit area but also to reduce the overall power consumption, thereby realizing a display data memory having a high access speed and a small circuit area.

It will be appreciated by those skilled in the art that changes could be made to the disclosed embodiments described above without departing from the broad inventive concept thereof. It is understood, therefore, that the disclosed embodiments are not limited to the particular examples disclosed, but is intended to cover modifications within the spirit and scope of the disclosed embodiments as defined by the claims that follow.

What is claimed is:

1. A memory apparatus, comprising:
   a memory having N sub-memories, each of the sub-memory having M memory blocks, N being a positive integer, M being a positive integer;
   N×M arbiters respectively coupled to N×M memory blocks; and
   a memory controller, coupled to the N×M arbiters, for generating N×M sets of output request signals and output address signals according to an input signal set of an input request signal and an input address signal, and transmitting to the N×M arbiters,
   wherein a cycle period of each of the N×M output request signals is longer than a cycle period of the input request signal.

2. The memory apparatus according to claim 1, wherein the memory controller sequentially generates pulses in the N×M output request signals when the input request signal is a series-in pulse signal, so that a cycle period of each of the N×M output request signals is longer than a cycle period of the input request signal.

3. The memory apparatus according to claim 2, wherein the cycle period of each of the N×M output request signals is N×M times of the cycle period of the input request signal.

4. The memory apparatus according to claim 2, wherein in response to a (k)th pulse and a (k+1)th pulse of the input request signal, the memory controller generates pulses in two of the output request signals, and transmits to two of the arbiters, where k is a positive integer.

5. The memory apparatus according to claim 2, wherein in response to a (k)th pulse and a (k+(N×M))th pulse of the input request signal, the memory controller generates pulses in two of the output request signals, and transmits to two of the arbiters, where k is a positive integer.

6. The memory apparatus according to claim 1, further comprising:
   a host, coupled to the memory controller, for providing the input signal set of input request signal and input address signal.

7. A method for accessing a memory apparatus, the memory apparatus comprising a memory having N×M memory blocks coupled to N×M arbiters respectively, N being a positive integer, M being a positive integer, the method comprising:
   receiving an input signal set of an input request signal and an input address signal;
   generating N×M sets of output request signals and output address signals according to the input request signal and the input address signal; and
   transmitting the N×M sets of output request signals and output address signals to the N×M arbiters respectively, wherein a cycle period of each of the N×M output request signals is longer than a cycle period of the input request signal.

8. The method according to claim 7, wherein the step of generating the N×M sets of output request signals and output address signals comprises:
   sequentially generating pulses in the N×M output request signals when the input request signal is a series-in pulse signal, so that a cycle period of each of the N×M output request signals is longer than a cycle period of the input request signal.

9. The method according to claim 8, wherein the cycle period of each of the N×M output request signals is N×M times of the cycle period of the input request signal.

10. The method according to claim 8, wherein the transmitting step comprises:
    generating a pulse in one of the output request signals in response to a (k)th pulse and transmitting to one of the arbiters; and
    generating a pulse in another of the output request signals in response to a (k+1)th pulse and transmitting to another of the arbiters;
    where k is a positive integer.

11. The method according to claim 8, wherein the transmitting step comprises:
    generating a pulse in one of the output request signals in response to a (k)th pulse and transmitting to one of the arbiters; and
    generating a pulse in another of the output request signals in response to a (k+(N×M))th pulse and transmitting to another of the arbiters;
    where k is a positive integer.

* * * * *